(12) United States Patent
Li et al.

(10) Patent No.: US 9,391,001 B2
(45) Date of Patent: Jul. 12, 2016

(54) SEMICONDUCTOR CONSTRUCTIONS

(71) Applicant: Micron Technology, Inc., Boise, ID (US)

(72) Inventors: Hongqi Li, Boise, ID (US); Gowrisankar Damarla, Boise, ID (US); Robert J. Hanson, Boise, ID (US); Jin Lu, Boise, ID (US); Shyam Ramalingam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 177 days.

(21) Appl. No.: 13/975,722

(22) Filed: Aug. 26, 2013

(65) Prior Publication Data

US 2015/0054164 A1 Feb. 26, 2015

(51) Int. Cl.
*H01L 23/48* (2006.01)
*H01L 29/00* (2006.01)
*H01L 21/768* (2006.01)

(52) U.S. Cl.
CPC ........ *H01L 23/481* (2013.01); *H01L 21/76877* (2013.01)

(58) Field of Classification Search
CPC .................. H01L 21/76877; H01L 23/481
USPC ................ 257/520, 773, 774, 775, 776
See application file for complete search history.

(56) References Cited

U.S. PATENT DOCUMENTS 8,377,794 B2   2/2013   Tajima
2011/0108958 A1*  5/2011   Webb .................... 257/621

FOREIGN PATENT DOCUMENTS

JP          04-127148        4/1992

* cited by examiner

*Primary Examiner* — Hung Vu
(74) *Attorney, Agent, or Firm* — Wells St. John P.S.

(57) ABSTRACT

Some embodiments include semiconductor constructions having first and second electrically conductive lines that intersect with one another at an intersection. The first line has primarily a first width, and has narrowed regions directly against the second line and on opposing sides of the second line from one another. Electrically conductive contacts are along the first line and directly electrically coupled to the first line, and one of the electrically conductive contacts is directly against the intersection. Some embodiments include methods of forming intersecting lines of material. First and second trenches are formed, and intersect with one another at an intersection. The first trench has primarily a first width, and has narrowed regions directly against the second trench and on opposing sides of the second trench from one another. Material is deposited within the first and second trenches to substantially entirely fill the first and second trenches.

16 Claims, 6 Drawing Sheets

SEMICONDUCTOR CONSTRUCTIONS

TECHNICAL FIELD

Semiconductor constructions and methods of forming intersecting lines of material.

BACKGROUND

Integrated circuit fabrication may involve formation of intersecting lines of material. A method for forming such intersecting lines is to first form intersecting trenches, and to then fill such trenches with the material. A problem encountered during the fill of the trenches is that more material is required to fill intersecting regions than is required to fill other segments of the trenches. Such problem is explained with reference to FIGS. 1 and 2.

FIG. 1 shows a construction 2 having a pair of intersecting trenches 4 and 6 formed within a base material 5. The trenches 4 and 6 intersect with one another at an intersection 7.

FIG. 2 shows the construction 2 after material 8 is deposited within the trenches 4 and 6. The material 8 is deposited to sufficient thickness to completely fill trenches 4 and 6. However, such thickness is not sufficient to fill the intersection 7, and accordingly a void 9 is left within the intersection. Such void can be problematic during subsequent processing, and accordingly it is desired to prevent formation of the void 9. Unfortunately, if sufficient material is deposited to completely fill the intersection and thereby prevent formation of void 9, then excess material is deposited within other segments of the trenches 4 and 6 which leads to waste of the material 8. Accordingly, fabricators of integrated circuitry are faced with the dilemma of either leaving voids (like void 9) within intersecting trenches during the fill of the trenches, or overfilling the trenches and thereby wasting material in order to prevent the void formation. Is desired to develop methods and structures which circumvent such dilemma.

DETAILED DESCRIPTION OF THE ILLUSTRATED EMBODIMENTS

Some embodiments include modification of trench width at a location directly adjacent an intersection of two trenches in order to modify the intersection so that an amount of material required to fill the intersection is reduced relative to conventional constructions. In some embodiments, the amount of material required to fill the intersection is about the same amount required to fill other segments of the intersecting trenches. Example aspects of the invention are described with reference to FIGS. 3-15.

Figure 3:
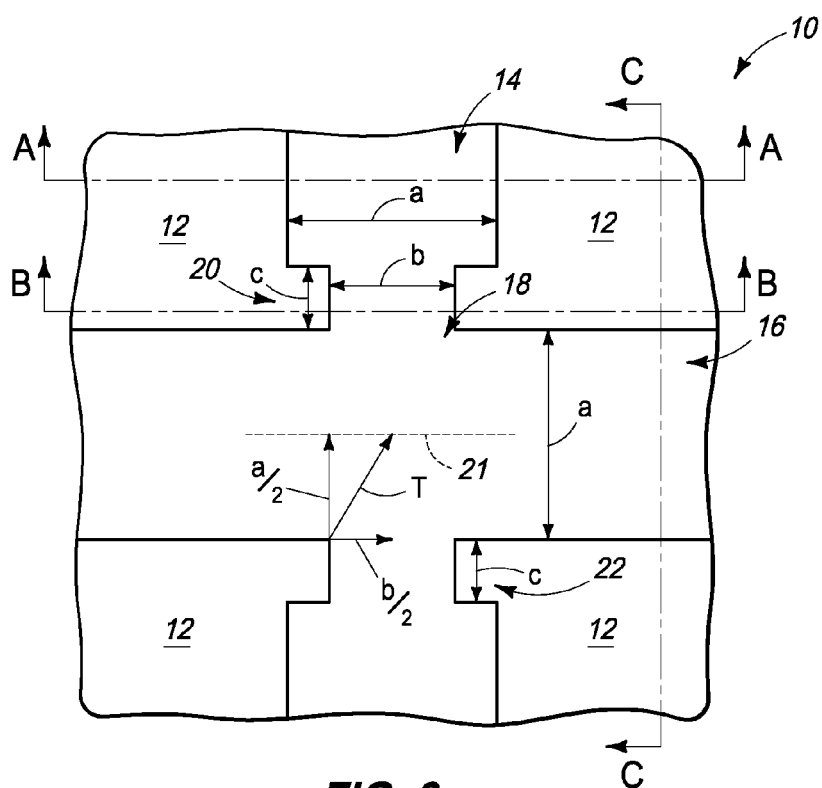
FIG. 3 is a diagrammatic top view of a semiconductor construction at a process stage of an example embodiment method.
Figure 4:
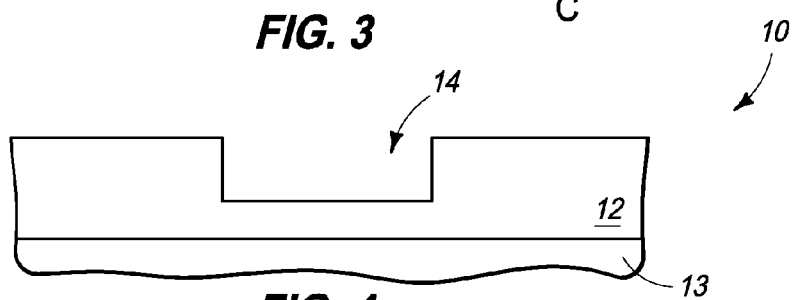
FIGS. 4-6 are diagrammatic cross-sectional views along the lines A-A, B-B and C-C, respectively of FIG. 3.
Figure 5:
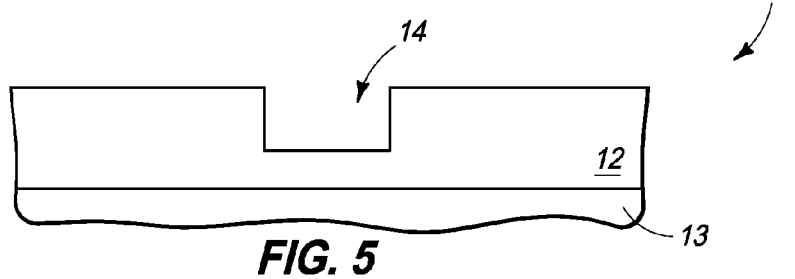
Figure 6:
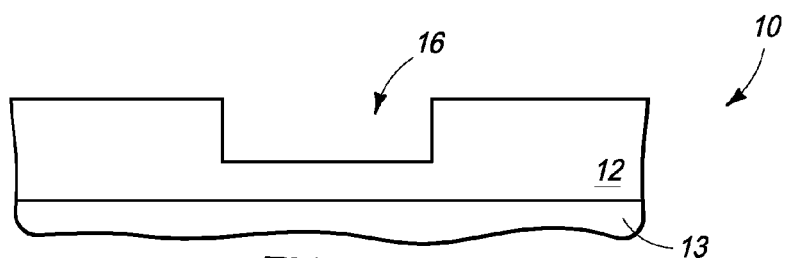

Referring to FIGS. 3-6, a construction 10 is shown in top view (FIG. 3), and in cross-sectional side views (FIGS. 4-6). The views of FIGS. 4-6 are along the lines A-A, B-B and C-C, respectively, of FIG. 3. The construction comprises a pair of trenches 14 and 16 that intersect one another at an intersection 18. The trenches 14 and 16 may be referred to as first and second trenches, respectively.

The trenches 14 and 16 are formed within a base 12. Such base may comprise any suitable composition or combination of compositions. In some embodiments, the trenches 14 and 16 are ultimately filled with electrically conductive material, and the base comprises electrically insulative material. Example electrically insulative materials that may be utilized in base 12 are silicon dioxide, silicon nitride, aluminum oxide, etc.

Although the base 12 is shown to be homogeneous, in other embodiments the base may comprise a plurality of different materials. The base is shown to be supported by a substrate 13. Such substrate may be any suitable substrate for supporting integrated circuitry, and in some embodiments may comprise semiconductor material, such as, for example, monocrystalline silicon. A substrate comprising semiconductor material may be considered to be a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, substrate 13 may correspond to a semiconductor substrate containing one or more materials associated with integrated circuit fabrication. Some of the materials may be under the shown region of base 12 and/or may be laterally adjacent the shown region of base 12; and may correspond to, for example, one or more of refractory metal materials, barrier materials, diffusion materials, insulator materials, etc.

The first and second trenches 14 and 16 are primarily of width "a". Such width may be any suitable width, and in some embodiments may be within a range of from about 150 nm to about 10 microns. Although both of the first and second trenches are shown to be the same widths as one another, in other embodiments the first and second trenches may be of different widths relative to one another. The trenches are indicated to be "primarily" of width "a" to indicate that the predominant portions of the trenches have approximately such width to within reasonable tolerances of fabrication and measurement. The primary width of the first trench 14 may be referred to as a first width, and the primary width of the second trench 16 may be referred to as a second width.

Figure 1:
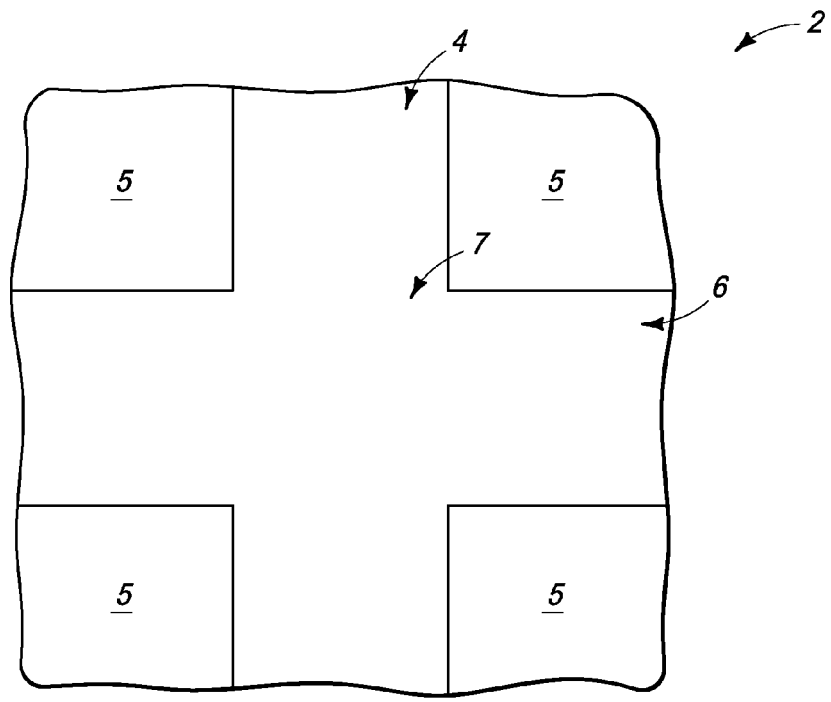
FIGS. 1 and 2 are diagrammatic top views of a semiconductor construction at stages of a prior art fabrication process.
Figure 2:
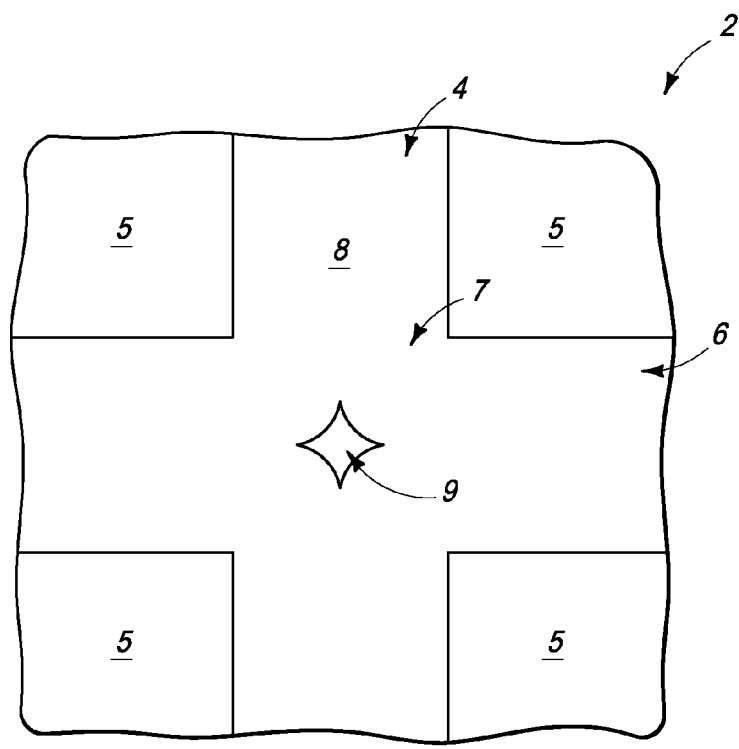

The first trench 14 has a pair of narrow regions 20 and 22 directly against the second trench 16 at the intersection 18. The narrowed regions 20 and 22 change the fill characteristics of intersection 18 relative to conventional trench intersections (such as, for example, the intersection 7 described above with reference to FIGS. 1 and 2), and can avoid the problems described above in the "Background" section.

Although narrowed regions 20 and 22 are shown to be identical to one another, and specifically are shown to be substantially mirror images of one another across a plane along the middle of trench 16 (with such plane being diagrammatically illustrated utilizing dashed line 21), in other embodiments the narrowed regions may be different from one another. Further, in some embodiments one of the narrowed regions may be omitted. The regions 20 and 22 are described as being "substantially" mirror images of one another in the shown embodiment to indicate that the narrowed regions are mirror images of one another to within reasonable tolerances of fabrication and measurement.

The narrowed regions 20 and 22 have widths "b". In some embodiments, width "b" may be within a range of from about 30% of width "a" to about 80% of width "a".

In the shown embodiment, the first and second trenches are substantially orthogonal to one another (with the term "substantially orthogonal" meaning that the trenches orthogonal to within reasonable tolerances of fabrication and measurement). In other embodiments, the intersecting trenches 14 and 16 may not be substantially orthogonal to one another. In the shown embodiment in which the trenches are substantially orthogonal to one another, the second trench 16 may be considered to extend along a lateral dimension, and the first trench 14 may be considered to extend along a longitudinal direction which is substantially orthogonal to the lateral dimension. The narrowed regions have longitudinal dimensions "c", which may be less than or equal to the lateral dimensions "b" in some embodiments. With proper dimensions "c", the narrowed regions can be printed out without increasing photolithography difficulty.

The various dimensions "a", "b", and "c" may be any suitable dimensions for achieving a desired configuration. In some embodiments, the dimensions "a" and "b" may be tailored so that material may be deposited within the trenches to completely fill the intersection 18 and the trenches 14 and 16 without substantial overfill of the intersection or the trenches. Specifically, a geometrical relationship between a thickness "T" of deposited material, and the widths "a" and "b" is shown in FIG. 3, where the thickness is determined from the vectors $$\frac{a}{2} \text{ and } \frac{b}{2}.$$

A relationship $$k = \frac{b}{a}$$

may be defined, and then a suitable thickness "T" may be determined to be about $$\frac{a\sqrt{1+k^2}}{2}.$$

A cost savings ratio that may be achieved utilizing such thickness as compared to conventional methods may be determined to be about $$1 - \frac{\sqrt{2+2k^2}}{2}.$$

Thus, for k=0.5, the cost savings may be about 21%.

The narrowed regions 20 and 22 may be formed with any suitable processing, and in some embodiments may be incorporated into a reticle so that the narrowed regions are printed out with a remainder of a pattern during photolithographic processing.

Figure 7:
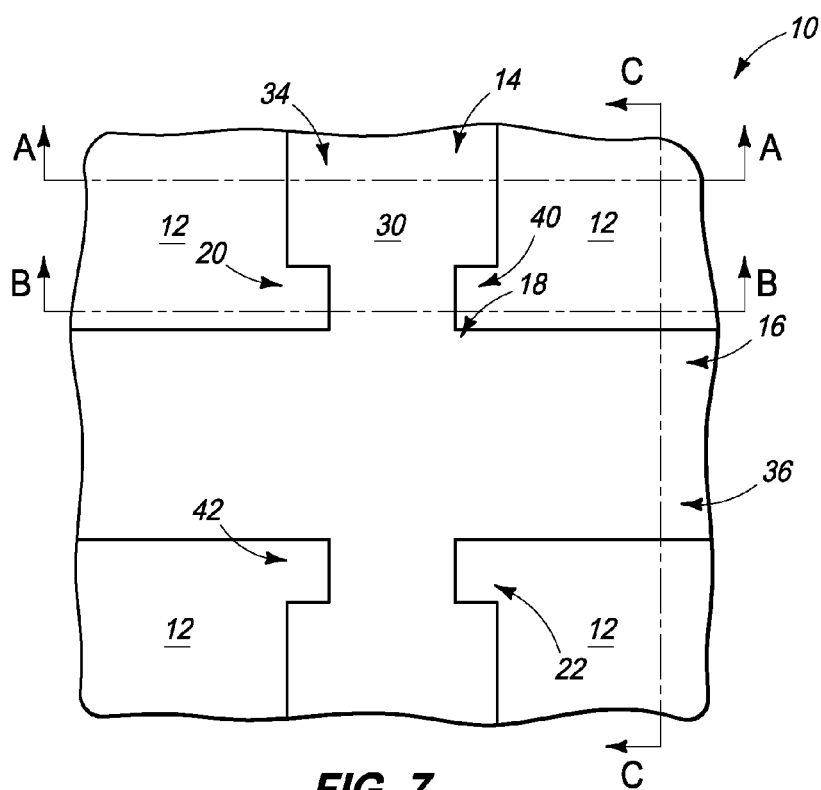
FIG. 7 is a diagrammatic top view of the semiconductor construction of FIG. 3 at a process stage subsequent to that of FIG. 3.
Figure 8:
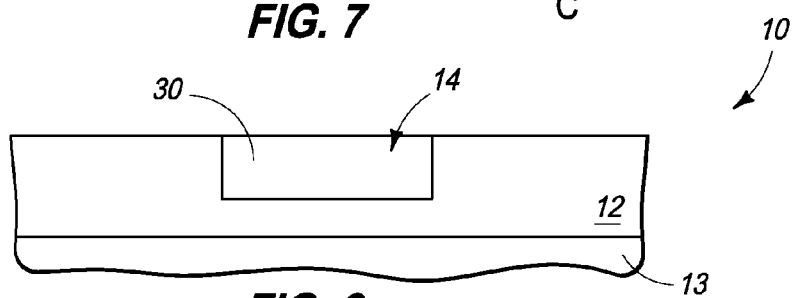
FIGS. 8-10 are diagrammatic cross-sectional views along the lines A-A, B-B and C-C, respectively of FIG. 7.
Figure 9:
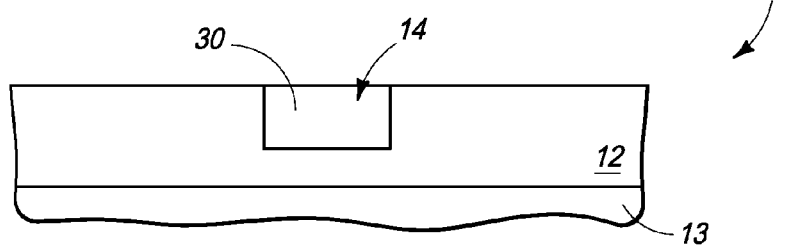
Figure 10:
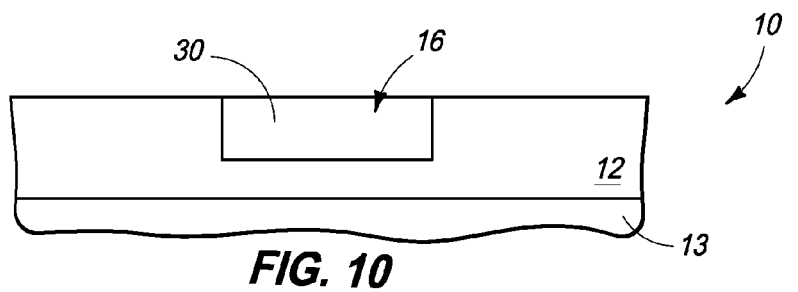

Referring to FIGS. 7-10, material 30 is deposited within trenches 14 and 16 to form lines 34 and 36, respectively, which intersect at intersection 18. The views of FIGS. 8-10 are along the lines A-A, B-B and C-C, respectively, of FIG. 7.

The material 30 may comprise any suitable composition or combination of compositions, and in some embodiments may be an electrically conductive material. Some example electrically conductive materials may comprise non-metal, metal, or metal-containing compositions; such as, for example, one or more of tungsten, titanium, titanium nitride, aluminum, doped-polysilicon, copper, etc.

The material 30 may be deposited utilizing any suitable methodology, including, for example, one or more of chemical vapor deposition (CVD), atomic layer deposition (ALD), physical vapor deposition (PVD), etc.

The material 30 may be deposited to a thickness determined by the equation described above with reference to FIG. 3, or by an analogous equation geometrically related to the dimensions of narrow regions 20 and 22. Such can enable material 30 to be deposited to a thickness which is substantially entirely fills trenches 14 and 16, and intersection 18, without overfilling the trenches or the intersection. Accordingly, the problems described above in the "Background" section may be avoided. In the event that there is some overfill of the trenches or the intersection, chemical-mechanical polishing (CMP) or other suitable planarization may be utilized to remove the excess material. Regardless, the trenches 14 and 16, and intersection 18, may be substantially entirely filled without the substantial waste of material that may occur when utilizing conventional methodologies, such as those described above in the "Background" section. In some embodiments, the cost savings which may be achieved utilizing methodology of FIGS. 3-10, relative to the prior art methodologies described in the "Background" section, are greater than 20%. Also, to the extent that trenches 14 and 16, and intersection 18, are overfilled with material 30 in methods of the present invention, the CMP utilized to remove excess material may be simpler and more cost-efficient than CMP utilized in conventional methods because there can be less excess material in methods of the present invention relative to conventional methods.

The lines 34 and 36 have narrowed regions 40 and 42 within the narrowed regions 20 and 22 of the trenches. Such narrowed regions of the lines may have the lateral dimensions "b" and longitudinal dimensions "c" discussed above with reference to FIGS. 3-6.

Figure 11:
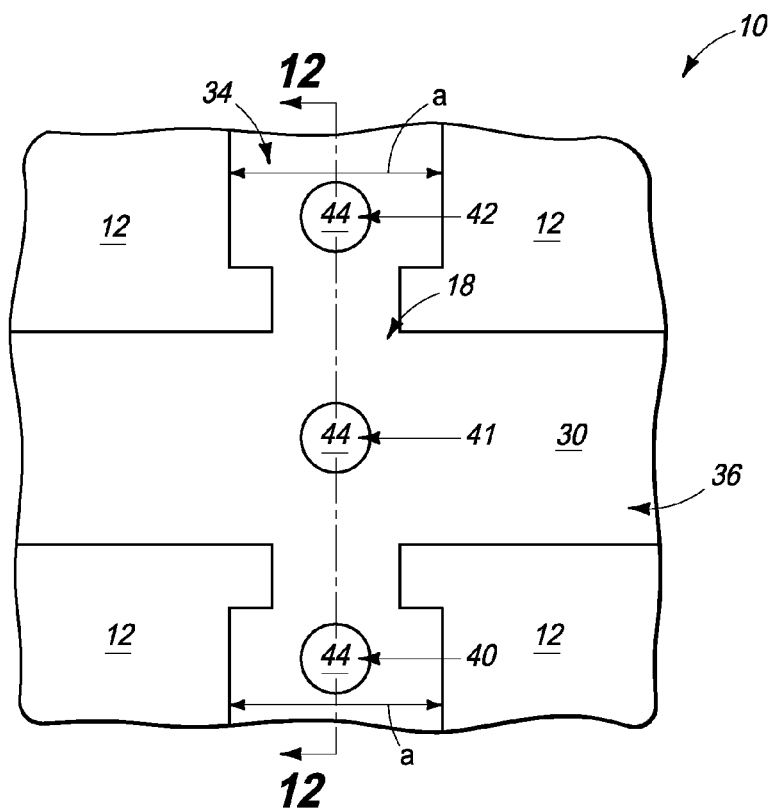
FIG. 11 is a diagrammatic top view of the construction of FIG. 3 at an example embodiment process stage subsequent that of FIG. 7.
Figure 12:
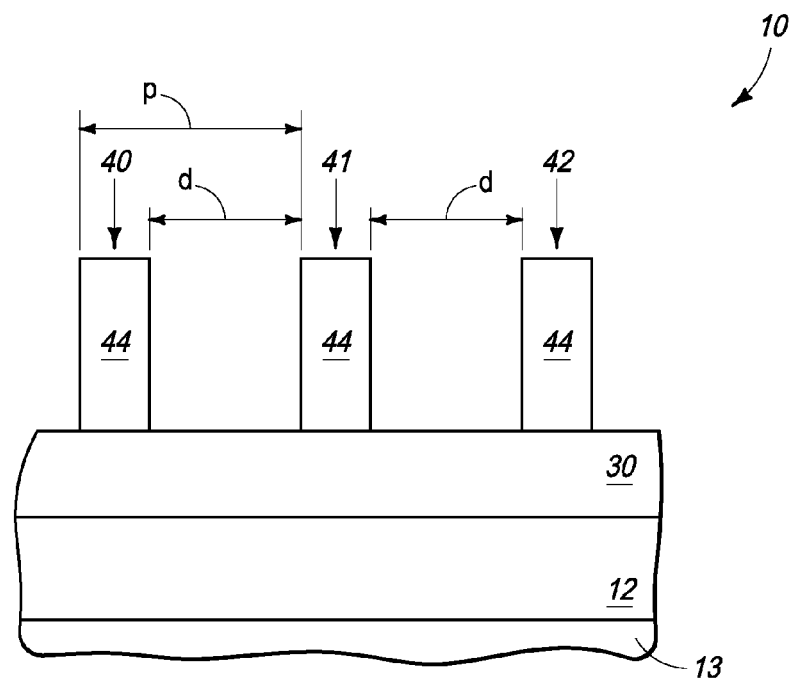
FIG. 12 is a diagrammatic cross-sectional view along the line 12-12 of FIG. 11.

Referring to FIGS. 11 and 12, construction 10 is shown at an example embodiment process stage following that of FIGS. 7-10. FIG. 11 is a top view, and FIG. 12 is a cross-sectional view along the line 12-12 of FIG. 11. Electrically conductive contacts 40-42 are formed along the electrically conductive line 34. The electrically conductive contacts comprise a material 44. Such material may be any suitable electrically conductive composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.).

The electrically conductive contacts 40-42 may be formed and patterned with any suitable methodology. For instance, in some embodiments a damascene type method may be utilized. Specifically, electrically insulative material (not shown) may be formed over base 12 and the lines 34 and 36, openings formed in the electrically insulative material utilizing a patterned mask and one or more suitable etches, and then the openings filled with material 44 to form the contacts. In other embodiments, material 44 may be formed across base 12 and lines 34 and 36, and then patterned with a suitable mask to create the contacts 40-42.

In the shown embodiment, the electrically conductive contacts 40-42 are spaced from one another by a common distance "d", and may be considered to be on a pitch "p". The contact 41 is directly against (i.e., directly electrically coupled with) conductive material 30 at intersection 18, and the contacts 40 and 42 are directly against (i.e., directly electrically coupled with) conductive material 30 at segments of line 34 having the primary width "a" described above with reference to FIGS. 3-6. The void 9 of the prior art construction of FIG. 2 would interfere with electrical coupling between contact 41 and material 30, but elimination of such void through methods of the present invention can enable desired electrical coupling to be achieved.

Figure 13:
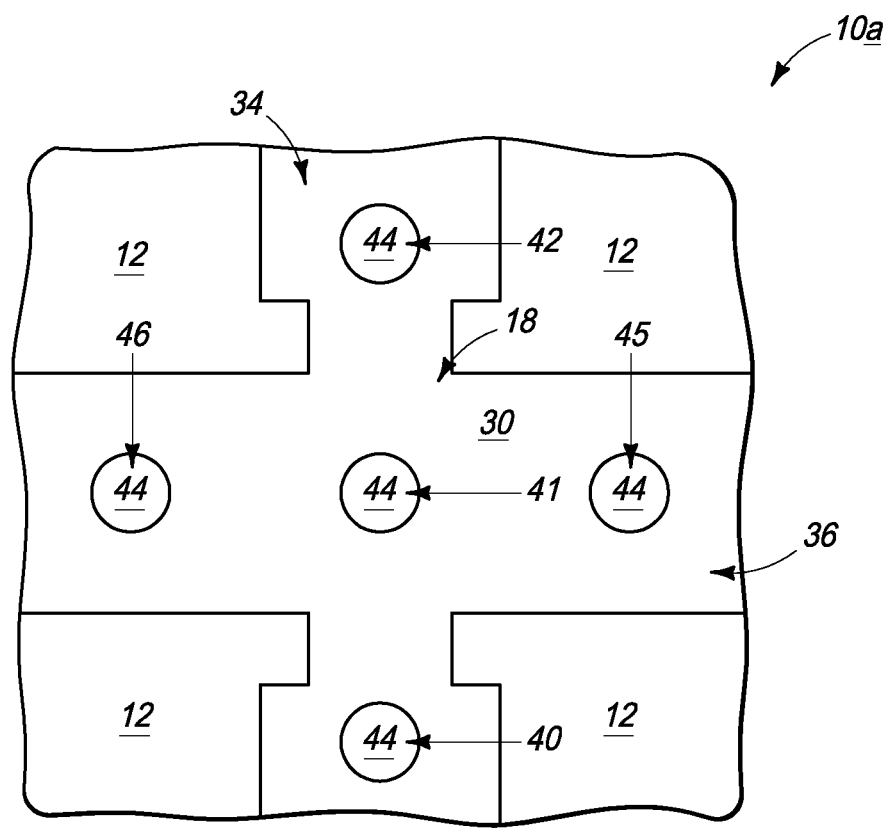
FIG. 13 is a diagrammatic top view of the construction of FIG. 3 at another example embodiment process stage subsequent that of FIG. 7.

Although the embodiment of FIGS. 11 and 12 shows contacts 40-42 only along the first line 34, in other embodiments the contacts may be along the second line 36 as well as along the first line 34. For instance, FIG. 13 shows a construction 10a having the contacts 40-42 along the first line 34, and also having contacts 45 and 46 along the second line 36, with the contacts 45 and 46 being directly electrically coupled to regions of the second line other than the intersection 18.

Figure 14:
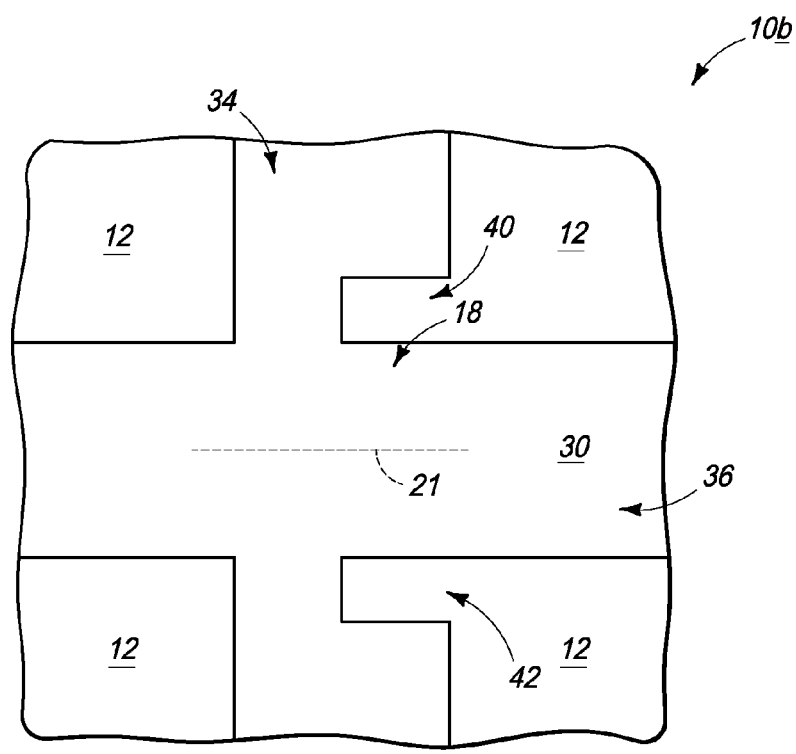
FIGS. 14 and 15 are diagrammatic top views of semiconductor constructions illustrating additional example embodiments.
Figure 15:
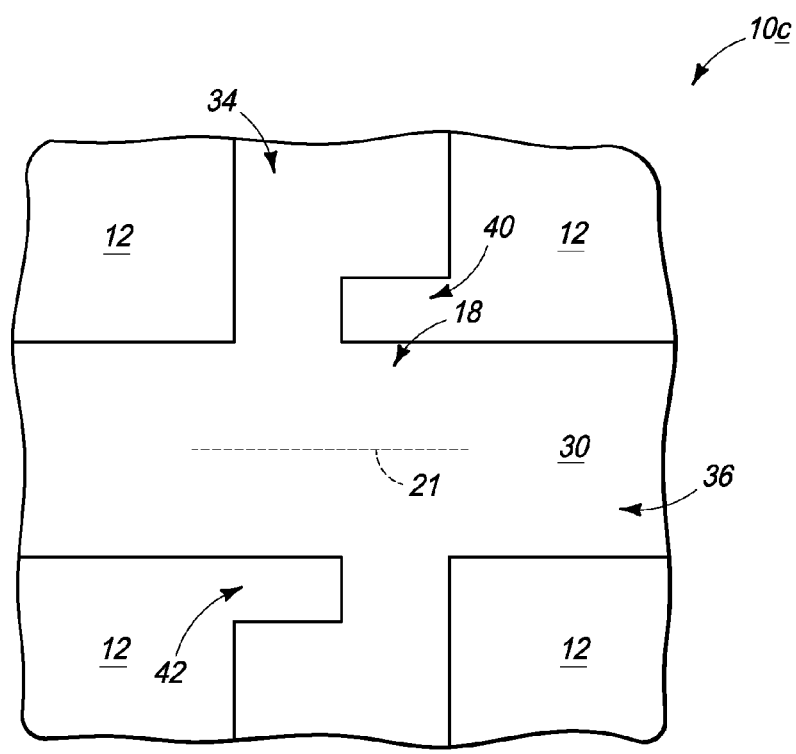

The embodiments of FIGS. 3-13 show some example configurations of trenches and electrically conductive lines having narrowed regions adjacent intersections. Other configurations may be utilized in other embodiments. FIGS. 14 and 15 illustrate a couple of example alternative arrangements.

Referring to FIG. 14, a construction 10b is shown at a processing stage analogous to that of FIG. 7. The configuration of FIG. 14 comprises intersecting lines 34 and 36 analogous to the intersecting lines described above with reference to FIG. 7, but differs from FIG. 7 in the arrangement of the narrowed regions 40 and 42. Similarly, FIG. 15 shows a construction 10c having intersecting lines 34 and 36 analogous to those described above with reference to FIG. 7, but differing from FIG. 7 in the arrangement of narrow regions 40 and 42. Notably, the regions 40 and 42 of FIG. 14 are substantially mirror images of one another across the plane 21 along line 36, and the regions 40 and 42 of FIG. 15 are not substantially mirror images of one another across such plane.

Although some of the applications described above pertain to formation of electrically conductive material within trenches, in other embodiments electrically insulative material (such as silicon dioxide, silicon nitride, etc.) may be formed within the trenches; and/or semiconductor material (such as germanium, silicon, etc.) may be formed within the trenches.

The structures discussed above may be incorporated into electronic systems. In some applications, the structures may be utilized for making connecting structures in memory chips, such as, for example, NAND, PCM, DRAM, etc. The electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

Unless specified otherwise, the various materials, substances, compositions, etc. described herein may be formed with any suitable methodologies, either now known or yet to be developed, including, for example, ALD, CVD, PVD, etc.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a semiconductor construction having first and second trenches that intersect at an intersection. The first trench has primarily a first width, and has a narrowed region directly against the second trench. Material is within the first and second trenches. The material within the first and second trenches is configured as first and second lines, respectively, which intersect at the intersection.

Some embodiments include a semiconductor construction having first and second electrically conductive lines that intersect with one another at an intersection. The first line has primarily a first width, and has narrowed regions directly against the second line and on opposing sides of the second line from one another. Electrically conductive contacts are along the first line and directly electrically coupled to the first line. One of the electrically conductive contacts is directly against the intersection.

Some embodiments include a method of forming intersecting lines of material. First and second trenches are formed, with the first and second trenches intersecting with one another at an intersection. The first trench has primarily a first width, and has narrowed regions directly against the second trench and on opposing sides of the second trench from one another. Material is deposited within the first and second trenches to substantially entirely fill the first and second trenches.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
   first and second trenches that intersect at an intersection;
   the first trench having primarily a first width, and having a narrowed region directly against the second trench;
   material within the first and second trenches, the material within the first and second trenches being configured as first and second lines, respectively, which intersect at the intersection;
   wherein the first trench has a pair of the narrowed regions on opposing sides of the second trench from one another;
   wherein the narrowed regions have lateral dimensions along and parallel with the second trench, and have longitudinal dimensions orthogonal to the lateral dimensions; and
   wherein the longitudinal dimensions are less than or equal to the lateral dimensions.

2. The construction of claim 1 wherein the narrowed regions are substantially mirror images of one another across a plane along the second trench.

3. The construction of claim 1 wherein the narrowed regions are not substantially mirror images of one another across a plane along the second trench.

4. The construction of claim 1 wherein the second trench has primarily a second width, and wherein the first and second widths are substantially the same as one another.

5. The construction of claim 1 wherein the second trench has primarily a second width, and wherein the first and second widths are not substantially the same as one another.

6. The construction of claim 1 wherein the material is electrically conductive.

7. The construction of claim 1 wherein the material is electrically insulative.

8. The construction of claim 1 wherein the material is a semiconductor material.

9. The construction of claim 1 wherein the material comprises one or more metals.

10. A semiconductor construction, comprising:
    first and second electrically conductive lines that intersect with one another at an intersection;
    the first line having primarily a first width, and having narrowed regions directly against the second line and on opposing sides of the second line from one another;
    electrically conductive contacts along the first line and directly electrically coupled to the first line, one of the electrically conductive contacts being directly against the intersection;
    wherein the narrowed regions have lateral dimensions along and parallel with the second line;
    wherein the lateral dimensions are within a range of from about 30% of the first width to about 80% of the first width; and
    wherein the narrowed regions have longitudinal dimensions orthogonal to the lateral dimensions; and
    wherein the longitudinal dimensions are less than or equal to the lateral dimensions.

11. The construction of claim 10 wherein the electrically conductive contacts along the first line and the intersection are spaced from one another by a common distance.

12. The construction of claim 10 wherein the electrically conductive lines comprise metal.

13. The construction of claim 10 wherein the electrically conductive contacts are also along the second line and directly electrically coupled to the second line in regions other than the intersection.

14. The construction of claim 10 wherein the narrowed regions are substantially mirror images of one another across a plane along the second line.

15. The construction of claim 10 wherein the narrowed regions are not substantially mirror images of one another across a plane along the second line.

16. The construction of claim 10 wherein the narrowed regions have lateral dimensions along the second line, and wherein the lateral dimensions are less than or equal to about 80% of the first width.

* * * * *